United States Patent
Suemitsu et al.

(10) Patent No.: US 6,674,442 B1
(45) Date of Patent: Jan. 6, 2004

(54) IMAGE MEMORY SYSTEM

(75) Inventors: Tomohiko Suemitsu, Tokyo (JP); Tohru Ohkatsu, Tokyo (JP)

(73) Assignee: Namco Ltd., Tokyo (JP)

( * ) Notice: Subject to any disclaimer, the term of this patent is extended or adjusted under 35 U.S.C. 154(b) by 0 days.

(21) Appl. No.: 09/471,999

(22) Filed: Dec. 27, 1999

(51) Int. Cl.$^7$ .............................................. G06F 13/00
(52) U.S. Cl. ...................... 345/536; 345/531; 345/545; 711/100; 711/105; 711/200; 711/211
(58) Field of Search ................................ 711/137, 105, 711/100, 200, 211; 345/517, 536, 571, 530, 531, 545, 564; 709/223; 712/32; 710/110; 348/441

(56) References Cited

U.S. PATENT DOCUMENTS

| | | | |
|---|---|---|---|
| 5,983,325 A | * 11/1999 | Lewchuk | 711/137 |
| 6,000,007 A | * 12/1999 | Leung et al. | 711/105 |
| 6,005,592 A | * 12/1999 | Koizumi et al. | 345/517 |

OTHER PUBLICATIONS

Stone, Harold S., Microcomputer Interfacing 1983, Addison–Wesley, pp. 1–2.*

* cited by examiner

Primary Examiner—Kee M. Tung
Assistant Examiner—D K Singh
(74) Attorney, Agent, or Firm—Rabin & Berdo, P.C.

(57) ABSTRACT

An object of the invention is to provide an image memory system capable of efficiently reading out image data also in case of consecutively reading out image data from an image memory along a direction other than the direction in which a burst access can be performed.

In case that a bit-map image is partitioned into square or rectangular blocks and image data of pixels contained in one block are made to correspond to one row space, row spaces respectively corresponding to two blocks being adjacent to each other with a common side between them are made to belong to different synchronous DRAMs without fail and all of row spaces respectively corresponding to four blocks having commonly one vertex are made to belong to different banks. Thanks to this, blocks Aa-i and Aa-j are not adjacent to each other, and blocks Bb-i and Bb-j are not adjacent to each other, and therefore even in case of reading out image data of dots being consecutive crossing a side of a block, the same synchronous DRAM is not consecutively accessed before and behind the side.

3 Claims, 9 Drawing Sheets

Fig. 9

| G01 | G03 | G01 | G03 | G05 | G07 | ... |
| G04 | G02 | G04 | G02 | G08 | G06 | ... |
| G01 | G03 | G01 | G03 | G05 | G07 | ... |
| G04 | G02 | G04 | G02 | G08 | G06 | ... |
| G11 | G13 | G11 | G13 | G15 | G17 | ... |
| G14 | G12 | G14 | G12 | G18 | G16 | ... |
| ⋮ | ⋮ | ⋮ | ⋮ | ⋮ | ⋮ | |

| Column specifying bit string | x9 | x8 | x7 | x6 | x5 | x4 | x3 | x2 | x1 | x0 |
|---|---|---|---|---|---|---|---|---|---|---|

| Row specifying bit string | y9 | y8 | y7 | y6 | y5 | y4 | y3 | y2 | y1 | y0 |
|---|---|---|---|---|---|---|---|---|---|---|

(b)

| Column address bit string | y3 | y2 | y1 | y0 | x3 | x2 | x1 | x0 |
|---|---|---|---|---|---|---|---|---|

| Row address bit string | y9 | y8 | y7 | y6 | y5 | x9 | x8 | x7 | x6 | x5 |
|---|---|---|---|---|---|---|---|---|---|---|

| Bank changeover bit | x4 |
|---|---|

| Route selecting bit | $x4 \oplus y4$ |
|---|---|

Fig. 11

| | 16M SDRAM 2 banks | 64M SDRAM 4 banks | 128M SDRAM 4 banks | 256M SDRAM 4 banks | 8M SGRAM 2 banks | 16M SGRAM 2 banks |
|---|---|---|---|---|---|---|
| Nx+Ny | 21 (ex. Nx=10, Ny=11) | 23 | 24 | 25 | 19 | 20 |
| Nr | 11 | 12 | 12 | 13 | 9 | 10 |
| b | 1 | 2 | 2 | 2 | 1 | 1 |
| L | $0 \leq L \leq 8$ (usually L=4: 16×16 dots) | $0 \leq L \leq 8$ (usually L=4: 16×16 dots) | $0 \leq L \leq 9$ (usually L=4(32 ×16 dots), or L =5(16×32) | $0 \leq L \leq 9$ (usually L=4(32 ×16 dots), or L =5(16×32) | $0 \leq L \leq 8$ (usually L=4: 16×16 dots) | $0 \leq L \leq 8$ (usually L=4: 16×16 dots) |

Nx : Bit length of a column specifying bit string
Ny : Bit length of a row specifying bit string
Nr : Bit length of a row address bit string
Nc : Bit length of a column address bit string
b  : Index number representing the number of banks
L  : Number of the lower bits of a column specifying bit string for forming a column address bit string

IMAGE MEMORY SYSTEM

FIELD OF THE INVENTION

The present invention relates to an image memory system, and more particularly to an image memory system capable of quickly performing a read operation even in case of reading out image data from an image memory consecutively in an arbitrary direction.

BACKGROUND OF THE INVENTION

In recent years, with the increase of the processing speed of an image processing apparatus, a memory making it possible to quickly read and write image information has been demanded. And as a memory capable of meeting this demand, a high-speed DRAM called a synchronous DRAM or a synchronous graphic RAM is widespread.

Generally, among synchronous DRAMs there is a synchronous DRAM provided with two or more banks each having an independent address space, and such a synchronous DRAM has a feature that its banks can be operated independently of each other. In such a synchronous DRAM, however, the respective banks generally share an address bus, a command bus and a data bus among them.

In some synchronous DRAMs, an address bus and a command bus cannot be logically separated from each other in actual operation. That is to say, when a command is given to such a synchronous DRAM, a part of an address bus may be occupied, and it is not possible to give command data and address data separately. The reason is that address data also can be considered to be a part of command data and it is thought that a practical advantage is not obtained by logically separating them.

In this specification, a command which does not have its exclusive command line but makes a memory perform some operation by combining a plurality of control lines together is also called "command".

A synchronous DRAM is provided with a number of commands for operating this DRAM itself, and there are an "active command" and a "precharge command" among them. These commands are given to each bank. When an active command is issued, a row address is also given, and therefore when an active command is given, the row address of a cell to be accessed is specified at the same time.

A precharge command is a command for declaring a row space to be closed when an operation of accessing the row space has ended. In order to access a row space and then access another row space belonging to the same bank, it is necessary to perform a precharge operation to said bank before such another accessing operation.

And a synchronous DRAM can perform what is called a burst access operation. That is to say, when a column address is given within some row space to specify one cell, the synchronous DRAM can serially read or write data (for example, data of 8 bits in length) of a plurality of cells having the said cell as the forefront and being consecutive in column address as synchronizing these data with a single clock. Due to this, its operation in case of performing a burst access becomes very fast.

And in case of accessing optional column addresses also, if they are in the same row space, it can perform a fast access synchronized with a clock by giving consecutively column addresses. This is called a random column access. In case of consecutively accessing addresses in different row spaces, however, its operation speed is of the same degree as an ordinary DRAM.

By the way, the present applicant has proposed an image memory system capable of efficiently reading out image data using a synchronous DRAM having a 2-bank structure as an image memory in. Japanese Patent Provisional Publication No. 106,374/97. In case of storing image data of each dot which constitutes an image, the said image memory system divides the image (for example, a display image composed of 1,024 dots in the x-axis direction and 1,024 dots in the y-axis direction) into a number of blocks (one block contains image data of 16 dots ×16 dots, for example), and makes each block correspond to one row space of a synchronous DRAM and makes blocks being adjacent to each other with a common side between them belong to different banks respectively.

In this case, when coloring the divided blocks by bank (for example, coloring banks at one side with white and banks at the other side with gray), as shown in FIG. 2, one image has a checkered pattern taking a block as a constituent unit. In FIG. 2, as described later, one block is composed of 8 dots ×8 dots for convenience of explanation.

In case of storing an image into a synchronous DRAM in such a manner, an operation of reading out this image is as follows. In case of reading out image data of dots consecutively in the x-axis direction (from left to right in FIG. 2), a fast read operation can be performed by a burst access as described above in the same block (these data belong to the same row address).

And in the x-axis direction, in case of reading out image data of dots consecutively over three or more blocks crossing the boundaries of the blocks, namely, in case of accessing a row space belonging to a first bank and then accessing a row space belonging to a second bank and further accessing another row space belonging to the first bank, the operation is as follows.

Image data of blocks adjacent to each other are stored in different banks and it is enough to specify only the forefront address of column addresses in the same row space, and therefore it is possible to perform a precharge operation to a row space of a first bank as accessing a row space belonging to a second bank and further activate another row space of the first bank. Thanks to this, it is not necessary to take the trouble to take a time for precharging and activating the first bank and the time for precharging and activating the first bank results in being hidden seemingly, and therefore an efficient access can be performed.

On the other hand, in case of accessing consecutively image data in the y-axis direction, it is possible to perform a random column access in the same block (namely, in the same row) as described above.

Image data read out from an image memory in this way are stored in a display memory and then are read out from the display memory to be displayed on a display device.

In case of displaying an ordinary image, the image is often read out consecutively along the x-axis or y-axis direction, and in such a case a fast and efficient access can be performed by a burst access as described above.

However, it is not always in the x-axis or y-axis direction that image data of a stored image are read out from an image memory. For example, in case of tilting or turning a displayed object in a polygon drawing operation and the like, it is necessary to read out data of a texture and the like stored in an image memory in an oblique direction. In case of reading out data stored in an image memory in an oblique direction corresponding to the inclination or rotation of an image, storing these data in a display memory in order of reading out, reading out these data from the display memory in order of storing, and displaying them on a display screen, an object seems to tilt or turn on the display screen.

Since an image memory system disclosed in said patent laid-open publication cannot perform a burst access when attempting to read out stored image data in an oblique direction of an image, it is necessary to give a column address to each dot even in the same row space. And in case of accessing consecutively across the boundary between blocks, it is necessary to frequently give an active command or a precharge command, but in an ordinary synchronous DRAM, as described above, since a command bus and an address bus are not separated from each other, a column address cannot be given for a period of giving an active command or a precharge command.

Further, a waiting time to some degree is needed after an active command is issued to a bank until a column address is given to the bank, and after a precharge command is issued to a bank until an active address is given to the same bank.

Therefore, in case of attempting to read out image data in an oblique direction of an image, there is a problem that reading the image data is more delayed in comparison with a case of reading out in the lateral direction in which a burst access can be performed.

SUMMARY OF THE INVENTION

The present invention has been made under such a background and an object of the invention is to provide an image memory system capable of efficiently reading out image data even in case of reading out image data from an image memory consecutively along a direction other than the direction in which a burst access can be performed.

In order to attain the above-mentioned object, the present invention is characterized by an image memory system for storing image data related to pixels forming an image, comprising;

first and second memories each having at least two banks in them, a memory controller for controlling to read or write image data from or into said first and second memories, a first command address bus provided between said memory controller and the first memory, a second command address bus provided between said memory controller and the second memory, and a data bus provided commonly to said first and second memories; wherein in case that said image is partitioned into square domains each of which is composed of pixels being equal in number to pieces of image data capable of being stored in one row space of said first or second memory and image data of pixels contained in one square domain are made to correspond to one row space, image data of pixels contained in the respective square domains are stored in the first and second memories so that row spaces respectively corresponding to two square domains being adjacent to each other with a common side between them in the image belong to different memories and row spaces respectively corresponding to two square domains having commonly the same vertex and having no common side belong to different banks of the same memory.

As said first and second memories, for example, synchronous DRAMs or synchronous graphic RAMs can be used.

And the present invention is characterized by an image memory system for storing image data related to pixels forming an image, comprising;

first and second memories having at least two banks in them, a memory controller for controlling to read or write image data from or into said first and second memories, a first command address bus provided between said memory controller and the first memory, a second command address bus provided between said memory controller and the second memory, and a data bus provided commonly to said first and second memories; wherein in case that one or more square domains are made to be contained in one group when said image is partitioned into groups, and the number of words capable of being stored in one row space of said first and second memories and the number of pixels in said one group are made to be equal to each other, and further image data of every pixel of every square domain in one group are made to correspond to one row space, image data of pixels contained in the respective square domains are stored in the first and second memories so that (a) two square domains being adjacent to each other with a common side between them in the image belong to different memories and two square domains having commonly the same vertex and having no common side in the image belong to different banks of the same memory, or (b) two square domains being adjacent to each other with a common side between them in the image belong to different memories and two square domains having commonly the same vertex and having no common side in the image belong to the same group, or (c) two square domains being adjacent to each other with a common side between them in the image belong to the same group and two square domains having commonly the same vertex and having no common side in the image belong to different banks of the same memory, or (d) two square domains being adjacent to each other with a common side between them in the image belong to the same group and two square domains having commonly the same vertex and having no common side in the image belong to the same group.

Furthermore, the present invention is characterized by an image memory system in which image data related to the respective pixels of an image composed of pixels arranged at positions specified by combination of a row specifying bit string of Ny bits in length and a column specifying bit string of Nx bits in length is stored in specific two memories, wherein;

said respective two memories have $2^b$ (where b is a positive integer) banks capable of being operated independently of each other, make it possible to consecutively access synchronously with a clock a specified number of pieces of data at consecutive addresses in the same row space on the basis of addresses specified by a row address bit string of Nr bits in length and a column address bit string of Nc (Nc=Nx+Ny−Nr−b−1) bits in length in a bank specified by a bank changeover bit (or a bank changeover bit string), and have a route selecting bit for specifying a memory to be accessed out of said two memories, and said image memory system comprises;

a means for forming said column address bit string out of the lower L bits of said column specifying bit string and the lower (Nc−L) bits of said row specifying bit string, a means for forming said row address bit string out of the upper (Nx−L−Bx) bits of said column specifying bit string and the upper (Ny—Nc+L−By) bits of said row specifying bit string when Bx (>−1) and By (>=1) are arbitrary positive integers satisfying "Bx+By=b+1", and a means for forming a route selecting bit and a bank changeover bit string by using a bit string [bx] of Bx bits from the (L+1)th bit to the (L+Bx)th bit of said column specifying bit string and a bit string [by] of By bits from the (Nc−L+1)th bit to the (Nc−L+By)th bit of said row specifying bit string, wherein;

said route selecting bit is formed out of the exclusive OR of the (L+1)th bit of said column specifying bit string and the (Nc−L+1)th bit of said row specifying bit string, and said bank changeover bit string is formed out of a bit string obtained by removing either one bit of the (L+1)th bit of said column specifying bit string or the (Nc−L+1)th bit of said row specifying bit string, which are used for forming said route selecting bit, from a bit string obtained by combining both of said bit strings [bx] and [by] together.

And the present invention is characterized by an image memory system in which image data related to the respective pixels of an image composed of pixels arranged at positions specified by combination of a row specifying bit string of Ny bits in length and a column specifying bit string of Nx bits in length is stored in specific two memories, wherein;

said respective two memories have first and second banks capable of being operated independently of each other, make it possible to consecutively access synchronously with a clock a specified number of pieces of data at consecutive addresses in the same row space on the basis of addresses. specified by a row address bit string of Nr bits in length and a column address bit string of Nc (Nc=Nx+Ny−Nr−2) bits in length in said first bank or second bank specified by a bank changeover bit, and have a route selecting bit for specifying memory to be accessed out of said two memories, and said image memory system comprises;

a means for forming said column address bit string out of the lower L bits of said column specifying bit string and the lower (Nc−L) bits of said row specifying bit string, a means for forming said row address bit string out of the upper (Nx−L−1) bits of said column specifying bit string and the upper (Ny−Nc+L−1) bits of said row specifying bit string, a means for taking as said route selecting bit the exclusive OR of the (L+1)th bit of said column specifying bit string and the (Nc−L+1)th bit of said row specifying bit string, and a means for taking as said bank changeover bit the (L+1)th bit of said column specifying bit string or the (Nc−L+1)th bit of said row specifying bit string.

BRIEF DESCRIPTION OF THE DRAWINGS

FIG. 9 is a figure showing an example of arrangement of blocks in case of storing one group including four blocks into one row space when storing an image into a synchronous DRAM.

FIG. 10 is a diagram showing the relation of correspondence among bit strings for specifying the position of each pixel forming an image, bit strings for specifying the row address and the column address in the synchronous DRAMs 10A and 10B, a bank changeover bit, and a route selecting bit.

FIG. 11 is a table collectively showing concrete examples showing what values can be used as Nx, Ny, Nr, Nc etc. in case of carrying out the present invention using some memories being actually available on the market.

DETAILED DESCRIPTION OF THE PREFERRED EMBODIMENTS

Embodiments of the present invention are described as being compared with a conventional image memory system with reference to the drawings in the following.

Figure 1:
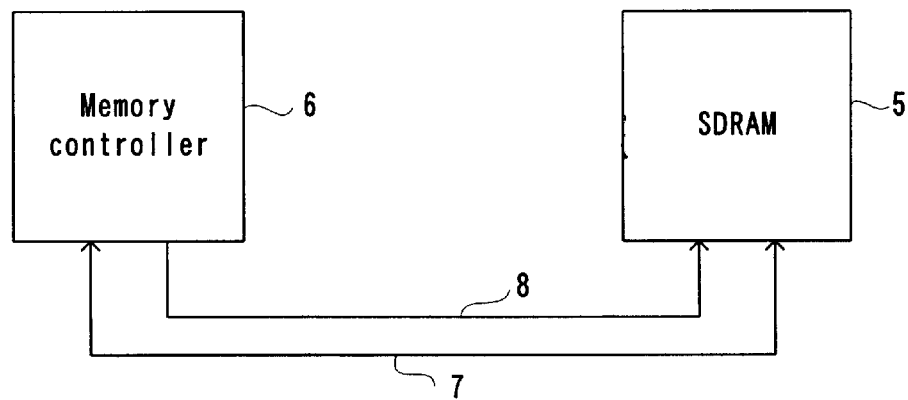
FIG. 1 is a block diagram roughly showing a synchronous DRAM used as an image memory and a memory controller for controlling operation of the synchronous DRAM in a conventional image memory system.

FIG. 1 is a block diagram roughly showing a synchronous DRAM 5 used as an image memory and a memory controller 6 for controlling operation of the synchronous DRAM in a conventional image memory system. The synchronous DRAM 5 is of a 2-bank structure (assuming that these banks are bank a and bank b), and one data bus 7 common to both of these banks is connected between the memory controller 6 and the synchronous DRAM 5. A command address bus (hereinafter referred to as "C.A. bus") 8 is connected between the synchronous DRAM 5 and the memory controller 6, but since a command bus and an address bus are not logically separated from each other in the C.A. bus 8 as described above, the memory controller 6 cannot issue a command and an address at the same time.

Figure 2:
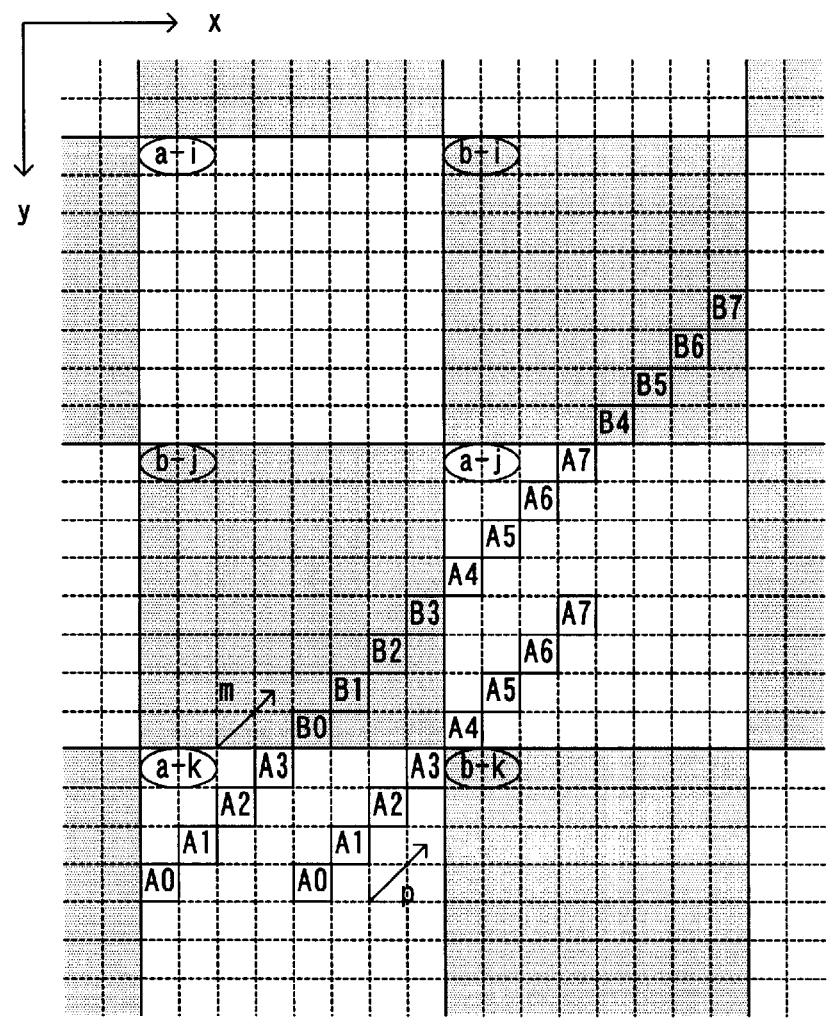
FIG. 2 is a diagram showing how an image is divided into a number of square blocks and what parts of a synchronous DRAM image data of pixels belonging to each block are stored in, in a conventional apparatus.

FIG. 2 is a diagram for explaining how an image is stored in the synchronous DRAM 5 which is an image memory in a conventional image memory system.

In FIG. 2, it is assumed that the horizontal direction is the x-axis direction and the vertical direction is the y-axis direction. Blocks a-i, a-d, a-k, . . . which are square domains shown with white in the same figure and blocks b-i, b-j, b-k, . . . shown with gray are arranged so as to form a checkered pattern. Each block is composed of 8×8 small squares, and each of these small squares represents one dot (pixel) on a display. Image data related to one dot corresponds to one word (for example, 1 word=32 bits) of a memory. That is to say, image data related to one dot is data capable of being read and written with one address to the memory. It is a part of an image to be displayed on the display that is shown in FIG. 2, and parts other than this can be also shown in the same way.

Here, block a-i means that image data of dots belonging to this domain are stored in the same row space (the number of which is i in this case) belonging to bank a of the synchronous DRAM 5, and block b-i means that image data of dots belonging to this domain are stored in the same row space (the number of which is i in this case) belonging to bank b of the synchronous DRAM 5. The same can be said of the other blocks. Therefore, the same row address is allocated to image data of dots belonging to the same block.

And in one block, as an example, consecutive column addresses are allocated to the respective dots in such order that the address allocation proceeds from the left top corner dot to right in the x-axis direction and when it has reached the right end of the same block, it moves to the left end of the next row. However, the order in which column addresses are allocated is not limited to this. Image data of the respective dots are stored in an image memory according to these allocated addresses.

In FIG. 2, each block is composed of 8×8 dots for convenience of description, but in practice each block may be composed of 16×16 dots or other number of dots and does not always have to be square in shape. The following discussion can be applied to any of these cases as it is.

The synchronous DRAM 5 described here is controlled by the memory controller 6. When the memory controller 6 receives a read or write request from a CPU (not illustrated) and the like at the host side, the controller 6 gives the corresponding command or address to the synchronous DRAM 5 to control it. And the memory controller 6 performs also said address allocation to each image data as described above.

Figure 3:
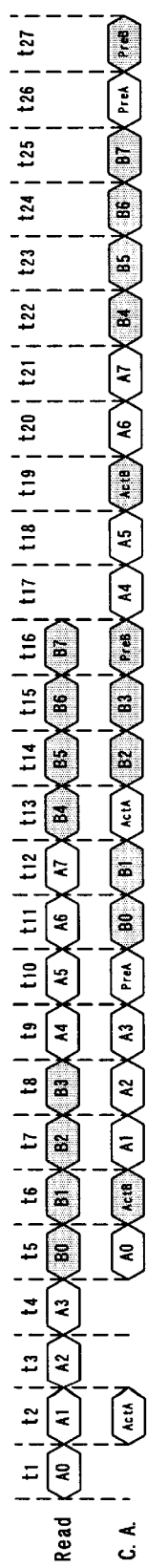
FIG. 3 is a diagram showing a timing chart in case of reading out image data of 16 dots A0 through A3, B0 through B3, A4 through A7, and B4 through B7 in this order along an oblique arrow m of 45 degrees in angle shown in FIG. 2.

FIG. 3 shows a timing chart in case of reading out from the synchronous DRAM 5 image data of 16 dots A0 to A3, B0 to B3, A4 to A7, and B4 to B7 in order of this along an oblique arrow m of 45 degrees in angle shown in FIG. 2. In case of reading out dot data of an image obliquely in such a way, since the column addresses are not consecutive even in the same row address, a burst access which is a feature of the synchronous DRAM cannot be performed and it is necessary to give a column address to each dot.

In FIG. 3, t1, t2 and the like on the top row are time slots corresponding to a clock, and the length of each time slot corresponds to the period of one clock. "Read" on the second row is an instruction given to the memory controller 6 from a CPU which is the host, and indicates image data of a dot to be read from the synchronous DRAM 5. "C.A." on the third row is a command or an address to be given to the synchronous DRAM 5 through a command address (C.A.) bus 8 from the memory controller 6. Since the C.A. bus 8 is not separated for command and address respectively as described above, it is represented by one chart in this way.

When a row address is specified and then a column, address is specified, after this point of time, data in the synchronous DRAM 5 used in this case are read out later by a certain period (for example a period of 2 clocks) in the same way as a general synchronous DRAM. However, since data itself is not put in question here, FIG. 3 does not show data to be read out.

The timing chart of FIG. 3 is described in the following. When an instruction to read out image data of dot A0 belonging to block a-k is issued from a CPU of the host to the memory controller 6 in time slot t1, the memory controller 6 gives an active command through the C.A. bus 8 in time slot t2 and activates bank a in which the said data are stored. Simultaneously with this activation, the row address of a cell in which the data to be accessed in the bank a is stored (here, the row address in which image data of a dot belonging to block a-k are stored) is given, and at this point of time, a row address out of addresses where data of dot A0 is stored is specified.

Next, in time slot t5, the memory controller 6 gives the column address of the dot A0 to the synchronous DRAM 5. The input of the column address must be a period of 2 clocks minimum later after activation of the bank in this example. Accordingly, the earliest time slot in which the memory controller 6 can give the column address of A0 is the time slot t5 before which a period of 2 clocks has passed after time slot t2. When the column address is given, after a period of 2 clocks for example has passed after this point of time, image data of dot A0 is read out from the said address to the data bus 7.

Instructions to read out image data of dot A1 (time slot t2), dot A2 (time slot t3), dot A3 (time slot t4), dot B0 (time slot t5), . . . following the image data of dot A0 (time slot t1) are given from the CPU to the memory controller 6 in consecutive order.

By the way, the memory controller 6 has received an instruction to read out image data of dot B0 belonging to block b-j (stored in bank b) at the point of time when the time slot t5 has passed. At this time, if a command bus and an address bus are logically separated from each other, it is possible to perform in parallel an operation of giving the column address of dot A1 and an operation of activating bank b. However, since a general synchronous DRAM is provided with a C.A. bus in which a command bus and an address bus are integrated together as described above, it is not possible to perform both of these operations at the same time. Thereupon, the memory controller 6 performs an operation of activating bank b and giving the row address of a cell in which data of block b-j are stored in time slot t6, prior to an operation of giving the column address of dot A1. This improves the efficiency.

After instructions to read out image data of dots B0, B1, B2 and B3 belonging to block b-j have been given from the CPU to the memory controller 6 in a period from time slot t5 to time slot t8, an instruction to read out image data of dot A4 belonging to block a-j has been given in time slot t9. Therefore, at this point of time, the memory controller 6 knows that the bank a of the synchronous DRAM 5 is accessed again.

As described above, in order to access another row space in the same bank, a precharge operation must be performed once to the bank before performing a new access. However, a precharge operation has not yet been performed to bank a at the point of time when time slot t9 has passed. Thereupon, in time slot t10 in which the access to image data of a dot belonging to block a-k of bank a has been ended, a precharge command to bank a is issued through the C.A. bus 8 prior to giving the column address of image data of a dot belonging to block b-j.

Then, after a necessary waiting period of 2 clocks has passed (for this period, the column addresses of dots B0 and B1 are given through the C.A. bus), an active command to bank a is issued in time slot t13 and the row address where image data of a dot of block a-j is stored is specified.

Following this, in the same way as described above, precharge commands, and active commands are issued on. Since the memory controller 6 knows that the accessing operation in this case is ended by reading out image data of dot B7 of block b-j and after this the bank a is not accessed, the memory controller 6 performs a precharge operation to the block a not immediately after time slot t21 when the column address of dot A7 has been given has passed but after waiting until time slot t26.

Thus, in case of reading out image data consecutively in an oblique direction of an image, since a burst access cannot be performed, it is necessary to give a column address to each dot even in the same row space, and furthermore, an active command or a precharge command needs to be issued at any time when it has become necessary to cross a block boundary as reading data of dots along an oblique direction. Therefore, in case of a synchronous DRAM having a C.A. bus in which a command bus and an address bus are integrated together, it is necessary to insert and issue an active command or a precharge command between column addresses through the same C.A. bus while giving column addresses in consecutive order. This becomes a cause of delaying a read operation.

Two or more column addresses may be consecutive to one another in the same row space depending upon an angle of inclination, and in such a place a burst access is partially performed. A case in which an oblique angle of reading out is 45 degrees has been described above, but this is the worst case. In case of turning an image, however, such a case often occurs.

Figure 4:
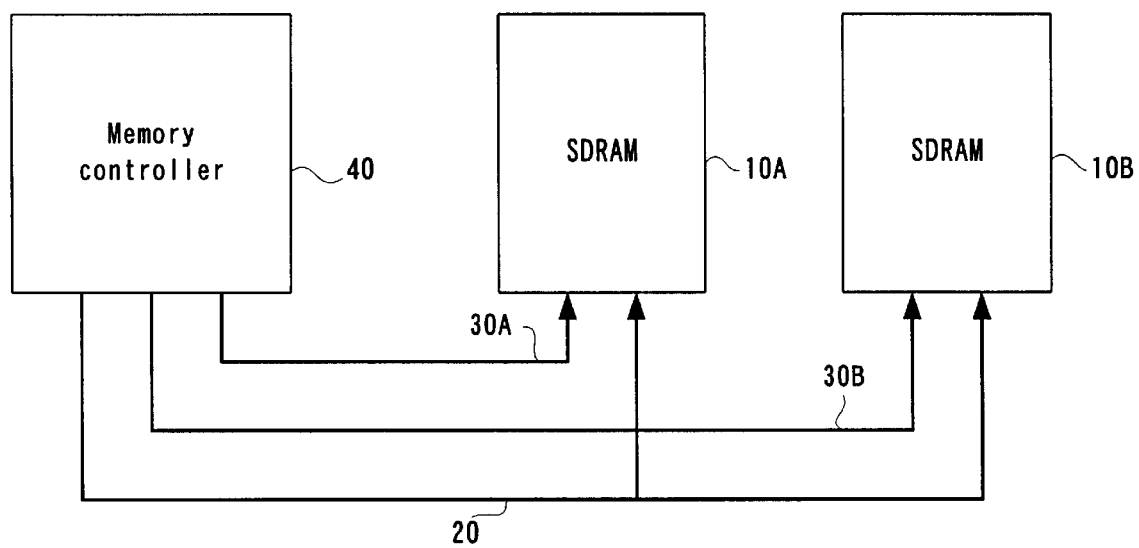
FIG. 4 is a block diagram showing an image memory, a memory controller, and a data bus and a command address bus (C.A. bus) for connecting these memory and controller.

Next, an image memory system of this embodiment is described. FIG. 4 is a block diagram showing an image memory, a memory controller, and a data bus and a command address bus (C.A. bus) for connecting these memory and controller.

As shown in FIG. 4, this embodiment is provided with two synchronous DRAMs 10A and 10B as an image memory having two banks a and b in them. Two routes are formed for each synchronous DRAM according to two respective banks a and b. The embodiment is provided with a data bus 20 common to both of these synchronous DRAMs, and is provided with C.A. buses 30A and 30B respectively for the synchronous DRAMs to connect these synchronous DRAMs to a memory controller 40.

Figure 5:
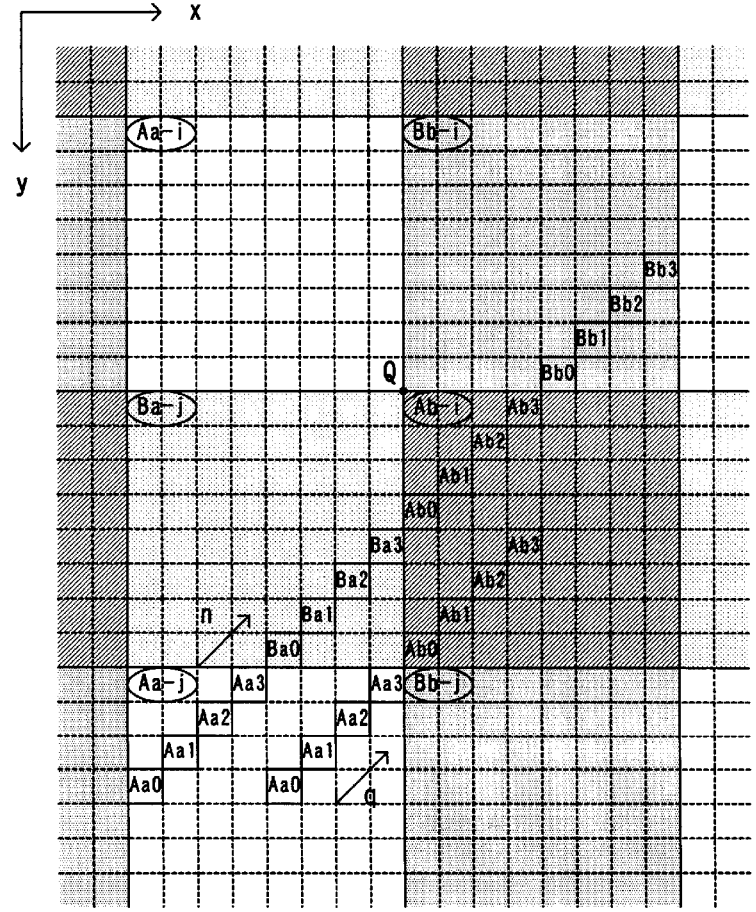
FIG. 5 is a diagram showing how the respective blocks are arranged in case of storing one image in a synchronous DRAM in an embodiment of the present invention.

FIG. 5 is a diagram showing how the respective blocks are arranged in case of storing one image into synchronous DRAMs. When storing an image in synchronous DRAMs, this embodiment arranges blocks each being a square domain as shown in FIG. 5.

In FIG. 5, block Aa-i represents "a block in which dots to be stored in the ith row space of bank a of synchronous DRAM 10A are contained". And block Bb-i represents "a block in which dots to be stored in the ith row space of, bank b of synchronous DRAM 10B are contained". The same can be applied to blocks Ba-j, Ab-i, Aa-j and Bb-j and the like.

In FIG. 5, each block is arranged according to a certain rule described below. That is to say, row spaces respectively corresponding to two blocks being adjacent to each other with a common side between them belong to different memories, and row spaces respectively corresponding to two blocks having one vertex (for example, vertex Q) in common but having no common side belong to different banks in the same memory. As a result, for example, blocks Aa-i and Ab-i the data of which are stored in the same synchronous DRAM 10A are not adjacent to each other with a common side between them, and blocks Bb-i and Ba-j the data of which are stored in the same synchronous DRAM 10B are not adjacent to each other with a common side between them.

When image data of each block are stored in such a way as described above, even in case of reading out image data of consecutive dots along any straight line direction except a case of reading out image data along a straight line passing a vertex of a block, when crossing the boundary between blocks, banks respectively belonging to different synchronous DRAMs are always accessed before and after the time of crossing. On the other hand, in case of reading out image data consecutively along a straight line passing a vertex of a block, different banks in the same synchronous DRAM are accessed before and behind the said vertex.

Figure 6:
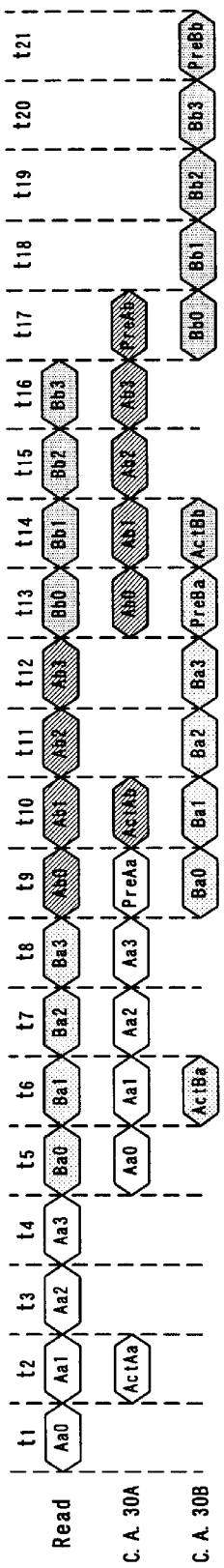
FIG. 6 is a timing chart in case of reading out image data of 16 dots Aa0 through Aa3, Ba0 through Ba3, Ab0 through Ab3, and Bb0 through Bb3 in this order along an oblique arrow n of 45 degrees in angle shown in FIG. 5 from either of synchronous DRAMs 11A and 10B.

FIG. 6 is a timing chart in case of reading out image data of 16 dots Aa0 through Aa3, Ba0 through Ba3, Ab0 through Ab3, and Bb0 through Bb3 in order of this along an oblique arrow n of 45 degrees shown in FIG. 5 from either synchronous DRAMs 10A or 10B, and corresponds to FIG. 3. In this case also, since an image is read out in an oblique direction, column addresses are not consecutive even in the same row address and therefore it is necessary to give a column address to each dot without performing a burst access.

FIG. 6 is equal to FIG. 3 in that t1, t2 and the like on the top row represent time slots corresponding to a clock signal and in that "Read" on the second row represents instructions from the CPU of which image data of dot the memory controller 40 should read out. And "C.A. 30A" on the third row represents a command or address signal to be given from the memory controller 40 through the C.A. bus 30A to the synchronous DRAM 10A, and "C.A. 30B" on the fourth row represents a command or address signal to be given from the memory controller 40 through the C.A. bus 30B to the synchronous DRAM 10B. This case is the same as the case of FIG. 3 in that it is not possible to issue a command and an address at the same time to the same synchronous DRAM using one C.A. bus.

In FIG. 6, an instruction to read out image data of dot Aa0 belonging to block Aa-j is issued from the CPU to the memory controller 40 in time slot t1. Then the memory controller 40 issues an active command through the C.A. bus 30A to the synchronous DRAM 10A in time slot t2 and activates bank a of the synchronous DRAM 10A in which the said data are stored. By this, the address of arrow space in which image data of dots belonging to block Aa-j are stored is given.

Next, in time slot t5 when a necessary waiting period of 2 clocks has passed after time slot t2, the memory controller 40 gives the column address of the dot Aa0 to the synchronous DRAM 10A. After a period of 2 clocks has further passed after the point of time when the column address is given, the image data of dot Aa0 is read out from the said address to the data bus 20.

Following the instruction to read out the image data of dot Aa0 (time slot t1), instructions to read out image data of dot Aa1 (time slot t2), dot Aa2 (time slot t3) and dot Aa3 (time slot t4) are given from the CPU to the memory controller 40 in this order, and the column addresses of image data of these dots are given correspondingly in a period of time from time slot t5 to t8, and the address of each image data is specified. And after a period of 2 clocks has further passed after the column addresses are given, each image data is read out onto the data bus 20.

By the way, at a point of time when time slot t5 has passed, the memory controller 40 knows that it has been instructed to read out image data of dot Ba0 belonging to block Ba-j (which is stored in bank a of the synchronous DRAM 10B). In such a case, since a conventional apparatus shown in FIGS. 2 and 3 has a single synchronous DRAM and uses a single C.A. bus in which a command bus and an address bus are not logically separated from each other, it has been unable to perform both an operation of giving the column address of a cell belonging to one bank and an operation of activating the other bank at the same time. Therefore, as described in FIG. 3, in time slot t6 prior to an operation of giving the column address of dot A1 (time slot t7), the memory controller has performed with priority an operation of activating bank b.

On the other hand, in the present embodiment, as described above, by storing image data of each dot such, that each block is arranged shown in FIG. 5, banks respectively corresponding to blocks Aa-j and Ba-j adjacent to each other result in belonging to synchronous DRAMs different from each other. In addition, as shown in FIG. 4, the synchronous DRAMs are respectively provided with the C.A. buses 30A and 30B. Thanks to this, it is possible to perform in parallel an operation of activating a bank corresponding to block Ba-j through the C.A. bus 30B in time slot t6 in a period (from time slot t5 to time slot t8) during which the column addresses of image data of dots belonging to block Aa-j are being given.

When activation of a bank corresponding to block Ba-j has ended in this way, the column address of dot Ba0 is given through the C.A. bus 30B in time slot t9 after a necessary waiting period of 2 clocks has passed, and after this the column addresses of dots Ba1 (time slot t10), Ba2 (time slot t11) and Ba3 (time slot t12) are given in consecutive order through the same C.A. bus 30B.

On the other hand, considering the synchronous DRAM 10A, the memory controller 40 knows that the access to the bank a of the synchronous DRAM 10A has been inrterrupted in time slot t5. Thereupon, when the access (specifying a column address) to the bank a of the synchronous DRAM 10A has ended in time slot t8, a precharge command of the bank a of the synchronous DRAM 10A is issued through the C.A. bus 30A in time slot t9.

And in the same time slot t9, an instruction to read out image data of dot Ab0 belonging to bank b of the synchronous DRAM 10A is issued from the CPU to the memory controller 40. Receiving this, the memory controller 40 issues an active command for activating the bank b of the synchronous DRAM 10A in time slot t10 and specifies the row address of an address space to which image data of dot Ab0 belongs. At this time, column addresses are given in consecutive order to cells of bank a of the synchronous DRAM 10B through the C.A. bus 30B, as described above, and in this case also, since the C.A. bus 30A and the C.A. bus 30B are provided separately from each other, such a parallel operation can be performed. After this, the reading out is performed in order by repeating the same operation.

Seeing FIG. 6, the following can be known. Active commands from the memory controller 40 are respectively issued in time slots t2, t6, t10 and t14, and they are always issued alternately to the C.A. bus 30A and the C.A. bus 30B. And precharge commands are respectively issued in time slots t9, t13, t17 and t21, and they are always issued also alternately to the C.A. bus 30A and the C.A. bus 30B. As a result, during a period from time slot t5 to t20 column addresses are given without fail through either one of the C.A. buses, and a process of sending out a column address from the memory controller 40 to the synchronous DRAM 10A or 10B is not interrupted. Thanks to this, there is no wasteful time and the efficiency of reading out image data is improved.

On the other hand, seeing the waveforms of the C.A. bus 30A and the C.A. bus 30B, there is not a time slot in which a column address is given to both of the C.A. buses 30A and 30B at the same time. This means that image data are not read out at the same time from the synchronous DRAMs 10A and 10B. From this, the adequacy of a fact that a single data bus 20 is provided commonly to the synchronous DRAMs 10A and 10B as described above (see FIG. 4) is understood.

However, it is technically possible also to provide a data bus for each synchronous DRAM, change the content of control of the memory controller and read out data at the same time from both of the synchronous DRAMs. In order to do so, however, a display memory for receiving read-out image data also needs an ability enough to process at the same time the image data from both of the synchronous DRAMs. And an image memory device has originally a number of data pins, but the number of data pins becomes double and a special consideration is required for mounting the devices on a printed-circuit board. Furthermore, a situation in which such a great amount of image data must be read out and processed at a time is exceptional, if it occurs. Therefore, it is usually enough for the data bus to have the capacity for only one synchronous DRAM, and in such a case a method of the present invention in which a column address is always given through either one of the C.A. buses is the most efficient.

Up to here, the case where a direction of reading out consecutively image data does not pass a vertex of a block as shown by an arrow m of FIG. 2 or an arrow n of FIG. 5 has been described. In practice, however, a situation where image data are read out along a direction passing a vertex of a block may occur as shown by an arrow p of FIG. 2 and an arrow q of FIG. 5. An operation of reading out image data in such a case is described in the following.

Figure 7:
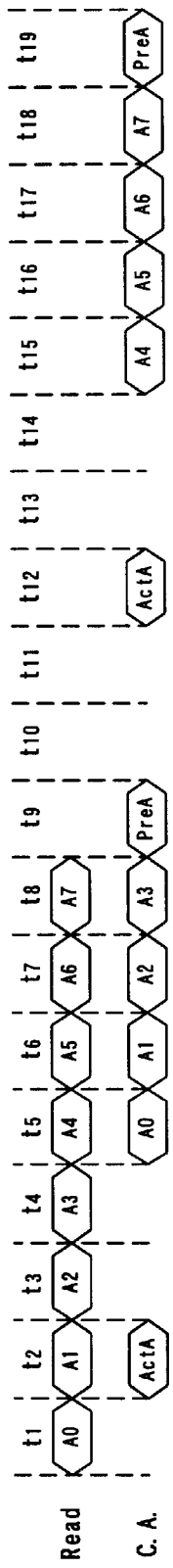
FIG. 7 is a timing chart in case of reading out image data of 8 dots A0 through A7 in the direction along an arrow p of FIG. 2 in the conventional image memory system shown in FIG. 2.

FIG. 7 is a timing chart in case of reading out image data of 8 dots A0 through A7 in the direction along an arrow p of FIG. 2 in the conventional image memory system shown in FIG. 2. As seen from FIG. 2, in this case, dots A0 through A3 belong to block a-k, and dots A4 through A7 belong to block a-j. However, both of image data of the dots belonging to these two blocks are stored in the same bank a of only one synchronous DRAM.

Therefore, when the column address of dot A3 is given through the C.A. bus 8 in time slot t8 of FIG. 7, the next row address is different from the former row address. Due to this, a precharge command is issued through the same C.A. bus 8 to the bank a in time slot t9.

And as described above, since a waiting period of 2 clocks becomes necessary after a precharge command is issued, in time slot t12 an active command for specifying a row space corresponding to block a-j of the same bank a to be next accessed is issued. Further, in time slot t15 after a waiting period of 2 clocks has passed after this, the column address of a cell in which image data of dot A4 belonging to block a-j is given. And a precharge command to bank a is issued in time slot t19 until when every access has ended.

In such a way, when image data are read out along a straight line passing a vertex of a block in a conventional image memory system, a vacant time during which no command nor address can be given to a C.A. bus occurs in time slots t10, t11, t13 and t14. Due to this, reading out image data is delayed by that time and the efficiency in point of time is degraded. The arrow p of FIG. 2 shows a case where the row address is changed in the same bank a, but the same can be applied for a case where the row address is changed in the same bank b (a case of reading out data consecutively along the direction perpendicular to the arrow p).

Figure 8:
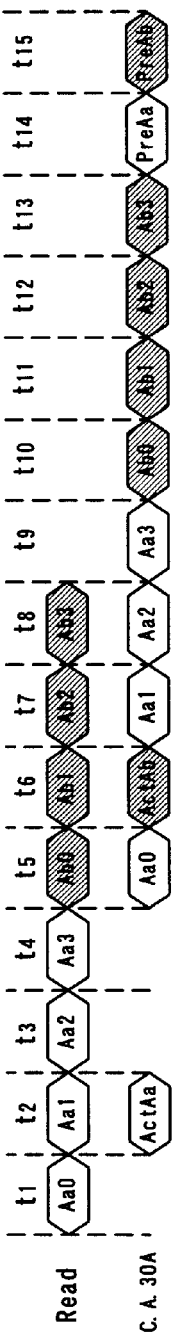
FIG. 8 is a timing chart in case of reading out image data of dots Aa0, Aa1, Aa2, Aa3, Ab0, Ab1, Ab2 and Ab3 so as to pass a vertex of a block along the direction shown by an arrow q in FIG. 5.

Next, the present embodiment is described. A timing chart in case of reading out image data of dots Aa0, Aa1, Aa2, Aa3, Ab0, Ab1, Ab2 and Aa3 so as to pass a vertex of a block along the direction shown by an arrow q in FIG. 5 is as shown in FIG. 8. In this case, image data of dots Aa0 through Aa3 belonging to block Aa-j are stored in a bank a of the synchronous DRAM 10A, and image data of dots Ab0 through Ab3 belonging to block Ab-i are stored in the other bank b which is contained in the same synchronous DRAM 10A as the bank a.

Since the memory controller 40 receives an instruction to read out data in a row space corresponding to block Ab-i from the CPU in time slot t5, in the next time slot t6 the memory controller 40 issues an active command to the bank b prior to giving the column address of image data of dot Aa1.

Thereupon, as described above, if two row spaces to be consecutively accessed belong to different banks, it is possible to access the next row space without performing a precharge to the row space first accessed. Seeing FIG. 5 along the arrow q, image data of dot Aa3 and image data of dot Ab0 to be next accessed are stored in different banks. Therefore, after the column address of image data of dot Aa3 is given in time slot t9, even if a precharge operation is not performed to the bank a, image data of dot Ab0 stored in the bank b can be read out. Due to this, in time slot t10 the column address of image data of dot Ab0 stored in the bank b is immediately given.

In this case, a precharge process to the bank a is performed in time slot t14 until when specifying the column address of every image data has ended, and a precharge process to the bank b is performed in time slot t15.

Comparing FIG. 7 of the prior art with FIG. 8, while it is in time slot t19 that the last process is ended in the timing chart of FIG. 7, it is in time slot t15 that the last process is ended in the timing chart of FIG. 8. Accordingly, this embodiment can read out image data in a shorter time in comparison with the prior art also in case of reading out the image data along a direction passing a vertex of a block.

Moreover, as seen from comparing FIG. 8 with FIG. 3 of the prior art, the present embodiment (FIG. 8), although its reading direction is passes a vertex of a block, is nearly equal to a conventional case (FIG. 3) whose reading direction passes no vertex in point of time required for reading out image data of 8 dots consecutively at an oblique angle of 45 degrees. Therefore, in case of reading out image data along a direction passing a vertex of a block, this embodiment becomes slower by a time necessary for inserting an active command (time slot t6 of FIG. 8) in comparison with other cases, but still this embodiment has an advantage that it can secure a speed of the same degree as a case of reading out image data without passing a vertex in a conventional image memory system.

The arrow q of FIG. 5 shows a case of accessing different banks in the same synchronous DRAM 10A, but the same can be applied for a case of accessing consecutively as passing a vertex of a block in the synchronous DRAM 10B (a case of reading out consecutively along the direction perpendicular to the arrow q).

FIG. 5 has shown a case of making one block (square domain) correspond to one row space, namely, a case of storing image data of every pixel contained in one block into one row space. This is easily extended to a case of making a plurality of blocks correspond to one row space, namely, a case of storing image data of every pixel contained in a plurality of blocks into one row space.

FIG. 9 is a figure showing an example of arrangement of blocks on an image in case of making four blocks (square domains) correspond to one row space when storing the image into a synchronous DRAM. In this specification, a plurality of blocks(square domains) corresponding to one row space in which image data are stored are referred to as a group.

In FIG. 9, a block designated as G01 belongs to group 1, a block designated as G02 belongs to group 2, a block designated as G03 belongs to group 3, and a block designated as G04 belongs to group 4 and so forth. And image data of pixels contained in block G01 and image data of pixels contained in block G02 are stored in different banks of one synchronous DRAM, and image data of pixels contained in block G03 and image data of pixels contained in block G04 are stored in different banks of the other synchronous DRAM. And in the same way as FIG. 5, each block is composed of 64 pixels of 8×8 dots. Accordingly, one group contains 256 pixels.

Seeing FIG. 9, the following can be understood. That is to say, two blocks being adjacent to each other with a common side between them on an image belong to different synchronous DRAMs, and two blocks having a common vertex and having no common side on an image belong to different banks of the same synchronous DRAM. In case that image data of the respective blocks are stored in the respective synchronous DRAMs in such a way, it is possible to quickly and efficiently read out image data in the same way as described in FIG. 6 or 8.

As a method of making a plurality of blocks (square domains) correspond to one row space, other methods are conceivable in addition to the method of FIG. 9. For example, there are i) a method of making two blocks being adjacent to each other with a common side between them on an image belong to different synchronous DRAMs and making two blocks having commonly the same vertex and having no common side in the image belong to the same group, ii) a method of making two blocks being adjacent to each other with a common side between them on an image belong to the same group and making two blocks having commonly the same vertex and having no common side in the image belong to different banks of the same synchronous DRAM, and iii) a method of making two blocks being adjacent to each other with a common side between them on an image belong to the same group and making two blocks having commonly the same vertex and having no common side in the image belong to the same group.

Next, generation of addresses required when storing or reading out image data in blocks partitioned and arranged as shown in FIG. 5 into or from the synchronous DRAM 10A or 10B is described. In FIG. 5, for convenience it has been assumed that each block is composed of 8×8 dots, but addresses obtained in the following description correspond to a block of 16×16 dots.

FIG. 10 shows the relation of correspondence among bit strings (a column specifying bit string and a row specifying bit string) for specifying the position of each pixel forming an image, bit strings for specifying the row address and the column address in said synchronous DRAMs 10A and 10B, a bank changeover bit, and a route selecting bit. A conversion process of such addresses is performed in the memory controller 40 (FIG. 4).

FIG. 10(a) shows a column specifying bit string "x0 to x9" of 10 (=Nx) bits in length for specifying a column of pixels forming an image and a row specifying bit string "y0 to y9" of 10 (=Ny) bits in length for specifying a row of pixels forming the image. The column specifying bit string and the row specifying bit string have respectively the lowest bits x0 and y0 as the first bits and the highest bits x9 and y9 as the 10th bits.

FIG. 10(b) shows a column address bit string of 8 (=Nc) bits in length for specifying a column address in the synchronous DRAMs 10A and 10B, a row address bit string of 11 (=Nr) bits in length for specifying a row address in these DRAMs 10A and 10B, a bank changeover bit, and a route selecting bit.

As shown in FIG. 10(b), the column address bit string is formed by taking the lower 4 (=L) bits of the column specifying bit string (see FIG. 9(a)), namely, x0, x1, x2 and x3 as its lower 4 bits and taking the lower 4 (=L) bits of the row specifying bit string (see FIG. 10(a)), namely, y0, y1, y2 and y3 as its upper 4 bits. On the other hand, the row address bit string is formed by taking the upper 5 bits of the column specifying bit string, namely, x5, x6, x7, x8 and x9 as its lower 5 bits and taking the upper 5 bits of the row specifying bit string, namely, y5, y6, y7, y8 and y9 as its upper 5 bits.

And the fifth bit x4 of the column specifying bit string is used as a bank changeover bit for changing over a bank. And the exclusive OR of the fifth bit x4 of the column specifying bit string and the fifth bit y4 of the row specifying bit string is allocated to a route selecting bit for selecting a route for accessing either the synchronous DRAMs 10A or 10B.

As described above, the column address bit string, a row address bit string, a bank changeover bit and a route selecting bit which are obtained from a column specifying bit string "x0 to x9" and a row specifying bit string "y0 to y9" are used as addresses when accessing the synchronous DRAMs 10A and 10B.

When using such addresses, image data of pixels contained in one block shown in FIG. 5 are stored in the same row space. And row spaces respectively corresponding to two blocks being adjacent to each other with a common side between them belong to different memories. And row spaces respectively corresponding to two blocks having commonly the same vertex but having no common side belong to different banks in the same memory. In case of reading out image data also, these addresses are used.

The above-mentioned example has been explained taking as an example a case that a memory is composed of two banks, the bit length Nx of a row specifying bit string is 10, the bit length Ny of a column specifying bit string is 10, the bit length Nr of a row address bit'string is 11, and the bit length Nc=Nx+Ny-Nr-2 of a column address bit string is 8. However, the present invention can be generally applied also to a system in which the number of banks of a memory is $2^b$ ("b" is one of the positive integers).

In case that the number of banks of a memory is $2^b$, assuming that the bit length of a row address bit string is Nr, the bit length Nc of a column address bit string is "Nc=Nx+Ny-Nr-b-1". And it is possible to form a column address bit string out of the lower L bits of a column specifying bit string and the lower (Nc-L) bits of a row specifying bit string and form a row address bit string out of the upper (Nx-L-Bx) bits of a column specifying bit string and the upper (Ny-Nc+L-By) bits of a row specifying bit string. Here, Bx and By each are an integer being not less than 1 satisfying "Bx+By=b+1".

And in this case, a route selecting bit and a bank changeover bit string can be formed by using a bit string [bx] of Bx bits from the (L+1)th bit to the (L+Bx)th bit of a column specifying bit string and a bit string [by] of By bits from the (Nc-L+1)th bit to the (Nc-L+By)th bit of a row specifying bit string. Concretely, a route selecting bit is formed out of the exclusive OR of the (L+1)th bit of a column specifying bit string and the (Nc-L+1)th bit of a row specifying bit string, and a bank changeover bit string is formed out of a bit string obtained by removing either one bit of the (L+1)th bit of a column specifying bit string and the (Nc-L+1)th bit of a row specifying bit string, said bits being used for forming said route selecting bit, from a bit string obtained by combining both of [bx] and [by] together.

FIG. 11 is a table collectively showing concrete examples showing what values can be used as Nx, Ny, Nr, Nc etc. in case of carrying out the present invention using some memories being actually available on the market.

The present invention is not limited to the above-mentioned embodiments, but can be variously modified and varied within the scope of its gist. For example, although the above-mentioned embodiments have each block composed of 8×8 dots for convenience of description, in practice each block may be composed of 16×16 dots, 32×32 dots, or other dots in number and the shape of each block is not limited to a square but may be a rectangle whose longitudinal side and lateral side are different in number of dots from each other. In general, it is enough that each block is formed out of pixels of $2^n \times 2^m$ (n and m are positive integers), and all of these cases are included in the technical scope of the present invention.

And although FIG. 10 shows concretely how to obtain a column address bit string, a row address bit string, a bank changeover bit and a route selecting bit from a row specifying bit string and a column specifying bit string, this is simply an example and some combinations other than this are also possible.

Furthermore, the above-mentioned embodiments have been described taking as an example the case of using a synchronous DRAM as an image memory, but another memory, a synchronous graphic RAM for example, may be used as an image memory, and such a case is also included in the technical scope of the present invention.

As described above, in an image memory system of the present invention, in case that a first and a second memory are provided, each memory being provided with a command address bus, and an image is partitioned into square domains, image data of pixels contained in, for example, one square domain are made to correspond to one row space, image data of pixels contained in the respective square domains are stored in the first and second memories so that row spaces respectively corresponding to two square domains being adjacent to each other with a common side between them in the image belong to different memories without fail and row spaces respectively corresponding to two square domains having commonly the same vertex and having no common side belong to different banks of the same memory.

By doing in such a way, even in case that said memory such as a synchronous DRAM or a synchronous graphic RAM for example makes it possible to perform a burst access when reading out image data along a specific direction (ordinarily the horizontal direction) of an image but does not make it possible to perform a burst access when reading out image data along a direction other than that (particularly along an oblique direction of 45 degrees), for example when crossing a side of a square domain and accessing another row space, banks of different memories are accessed before and behind the side, and therefore it is possible that when one bank is given a column address through a command address bus dedicated to the memory, the other bank (belonging to a memory different from the memory to which the said bank belongs) is given a necessary command. Thanks to this, a wasteful time caused by a vacant time is omitted.

And when accessing in a direction passing a vertex of a square domain, different banks are accessed before and behind the vertex, and therefore the access speed of the image data is improved.

Furthermore, the present invention can be applied also to a case of storing image data of pixels contained in a plurality of square domains into one row space, and can be applied to not only a memory composed of 2 banks but also a memory composed of 4 banks, a memory composed of 8 banks and the like (a memory composed of $2^b$ banks in theory), and in any of these cases, it is possible to obtain an effect specific to the present invention as described above.

What is claimed is:

1. An image memory system in which image data related to the respective pixels of an image composed of pixels arranged at positions specified by combination of a row specifying bit string of Ny bits in length and a column specifying bit string of Nx bits in length is stored in specific two memories, wherein;

said two respective memories have $2^b$ (where b is a positive integer) banks capable of being operated independently of each other, make it possible to consecutively access synchronously with a clock a specified number of pieces of data at consecutive addresses in the same row space on the basis of addresses specified by a row address bit string of Nr bits in length and a column address bit string of Nc (Nc=Nx+Ny−Nr−b−1) bits in length in a bank specified by a bank changeover bit (or a bank changeover bit string), and have a route selecting bit for specifying a memory to he accessed out of said two memories, and said image memory system comprises;

a means for forming said column address bit string out of the lower L bits of said column specifying bit string and the lower (Nc−L) bits of said row specifying bit string, a means for forming said row address bit string out of the upper (Nx−L−Bx) bits of said column specifying bit string and the upper (Ny−Nc+L−By) bits of said row specifying bit string when Bx (>=1) and By (>=1) are arbitrary positive integers satisfying "Bx+By=b+1", and a means for forming a route selecting bit and a bank changeover bit string by using a bit string of Bx bits from the (L+1)th bit to the (L+Bx)th bit of said column specifying bit string and a bit string of By bits from the (Nc−L+1)th bit to the (Nc−L+By)th bit of said row specifying bit string, wherein;

said route selecting bit is formed out of the exclusive OR of the (L+1)th bit of said column specifying bit string and the (Nc−L+1)th bit of said row specifying bit string, and said bank changeover bit string is formed out of a bit string obtained by removing either one bit of the (L+1)th bit of said column specifying bit string or the (Nc−L+1)th bit of said row specifying bit string, which are used for forming said route selecting bit, from a bit string obtained by combining both of said bit strings and together.

2. An image memory system in which image data related to the respective pixels of an image composed of pixels arranged at positions specified by combination of a row specifying bit string of Ny bits in length and a column specifying bit string of Nx bits in length is stored in specific two memories of specific two systems, wherein;

said respective two memories have first and second banks capable of being operated independently of each other, make it possible to consecutively access synchronously with a clock a specified number of pieces of data at consecutive addresses in the same row space on the basis of addresses specified by a row address bit string of Nr bits in length and a column address bit string of Nc (Nc=Nx+Ny−Nr−2) bits in length in said first bank or second bank specified by a bank changeover bit, and have a route selecting bit for specifying a memory to be accessed out of said two memories, and said image memory system comprises;

a means for forming said column address bit string out of the lower L bits of said column specifying bit string and the lower (Nc−L) bits of said row specifying bit string, a means for forming said row address bit string out of the upper (Nx−L−1) bits of said column specifying bit string and the upper (Ny−Nc+L−1) bits of said row specifying bit string, a means for taking as said route selecting bit the exclusive OR of the (L+1)th bit of said column specifying bit string and the (Nc−L+1)th bit of said row specifying bit string, and a means for taking as said bank changeover bit the (L+1)th bit of said column specifying bit string or the (Nc−L+1)th bit of said row specifying bit string.

3. An image memory system according to claim 2, wherein either or both of the memories of said two memories are either of synchronous DRAMs and synchronous graphic RAMs.

* * * * *